(12) United States Patent
Song et al.

(10) Patent No.: US 7,919,778 B2
(45) Date of Patent: Apr. 5, 2011

(54) MAKING ORGANIC THIN FILM TRANSISTOR ARRAY PANELS

(75) Inventors: Keun-Kyu Song, Yongin-si (KR);
Bo-Sung Kim, Seoul (KR);
Seung-Hwan Cho, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 305 days.

(21) Appl. No.: 11/634,413

(22) Filed: Dec. 5, 2006

(65) Prior Publication Data
US 2008/0012008 A1    Jan. 17, 2008

(30) Foreign Application Priority Data

Jul. 12, 2006  (KR) .................. 10-2006-0065283

(51) Int. Cl.
*H01L 29/08* (2006.01)
*H01L 21/84* (2006.01)

(52) U.S. Cl. ....... 257/72; 257/66; 257/40; 257/E51.001; 257/E51.002; 257/E51.003; 257/E51.004; 257/E51.005; 257/E51.006

(58) Field of Classification Search ............ 257/40, 257/72, E51.006
See application file for complete search history.

(56) References Cited

U.S. PATENT DOCUMENTS

| 6,872,980 | B2 | 3/2005 | Cheng et al. |
| 7,026,644 | B2 | 4/2006 | Cheng et al. |
| 7,489,379 | B2 * | 2/2009 | Ahn et al. ............. 349/139 |
| 2004/0150761 | A1 | 8/2004 | Wong et al. |
| 2005/0270450 | A1 * | 12/2005 | Ahn et al. ............. 349/114 |
| 2006/0081849 | A1 * | 4/2006 | Lee et al. ............. 257/72 |
| 2006/0223222 | A1 * | 10/2006 | Choi et al. ............. 438/99 |
| 2007/0002249 | A1 * | 1/2007 | Yoo et al. ............. 349/141 |

FOREIGN PATENT DOCUMENTS

| JP | 2004-152959 | 5/2004 |
| JP | 2004-318058 | 11/2004 |
| KR | 10-0248392 | 12/1999 |
| KR | 2003-0074472 | 9/2003 |
| KR | 10-2004-0015806 | 2/2004 |
| KR | 10-2004-0043116 | 5/2004 |
| KR | 10-2005-0023012 | 3/2005 |

OTHER PUBLICATIONS

Patent Abstracts of Japan, Publication No. 2004-152959, May 27, 2004, 1 p.
Patent Abstracts of Japan, Publication No. 2004-318058, Nov. 11, 2004, 1 p.
Korean Patent Abstracts, Publication No. 100248392, Dec. 17, 1999, 2 pp.

(Continued)

*Primary Examiner* — Leonardo Andújar
*Assistant Examiner* — William Harriston
(74) *Attorney, Agent, or Firm* — Innovation Counsel LLP

(57) ABSTRACT

An organic thin film transistor (OTFT) array panel for a display device includes a gate line and a pixel electrode formed on a substrate, the gate line and pixel electrode each having a first conductive layer including a transparent conductive oxide and a second conductive layer including a metal, a data line crossing the gate line and including a source electrode, a drain electrode facing the source electrode and connected with the pixel electrode, and an organic semiconductor in contact with the source electrode and the drain electrode.

10 Claims, 19 Drawing Sheets

OTHER PUBLICATIONS

Korean Patent Abstracts, Publication No. 1020030074472, Sep. 19, 2003, 1 p.
Korean Patent Abstracts, Publication No. 10-2004-0015806, Feb. 19, 2004, 1 p.
Korean Patent Abstracts, Publication No. 10-2004-0043116, May 22, 2004, 1 p.
Korean Patent Abstracts, Publication No. 1020050023012, Mar. 9, 2005, 2 pp.

* cited by examiner

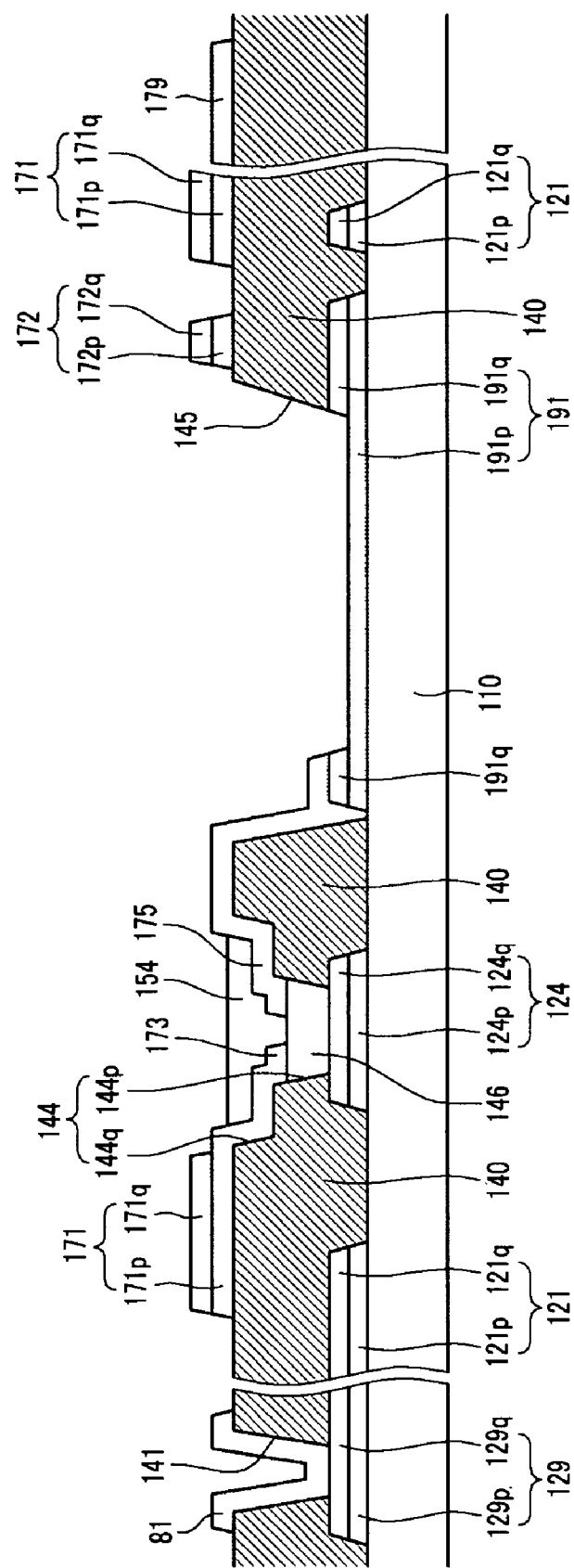

MAKING ORGANIC THIN FILM TRANSISTOR ARRAY PANELS

RELATED APPLICATIONS

This application claims priority of Korean Patent Application No. 10-2006-0065283, filed Jul. 12, 2006, the entire disclosure of which is incorporated herein by reference.

BACKGROUND

This disclosure relates to organic thin film transistor (OTFT) array panels for display devices and to methods for making them.

Flat panel display devices, such as liquid crystal displays (LCDs), organic light emitting diode (OLED) displays, electrophoretic displays, and the like, generally include a plurality of pairs of electrical field generating electrodes with an electro-optically active layer interposed therebetween. A LCD includes a layer of a liquid crystal material as the electro-optically active layer, and an OLED display includes an organic light emission layer as the electro-optically active layer.

Generally, one of the pair of electrical field generating electrodes is connected to a switching element, which provides it with an electrical signal, and the electro-optical active layer converts the electrical signal into an optical signal that enables the display of an image. Flat panel displays use TFTs, which are three-terminal elements, as the switching elements, and include gate lines for transmitting scan signals for controlling the TFTs, and data lines for transmitting image data signals to be applied to pixel electrodes.

Currently, organic TFTs (OTFTs), which include an organic semiconductor instead of inorganic semiconductor, such as silicon (Si), are being actively researched. Because the OTFT can be formed in either a fiber or a film type, in terms of the characteristics of the organic material, OTFTs are receiving much attention as a core element of a flexible display device. Also, because OTFTs can be fabricated by a solution process, such as ink jet printing, they can be applied relatively easily to large-scale flat panel display devices, the manufacture of which is limited only in terms of the deposition processes used for their application.

However, compared to inorganic semiconductors, organic semiconductors have relatively low heat and chemical resistances, so they can be easily damaged in the follow-up processes subsequent to their deposition. In addition, when source and drain electrodes are made of a low-resistance conductor, such as aluminum, a Schottky barrier is formed between the organic semiconductor and the source and drain electrodes, which can degrade the characteristics of the TFTs.

As a result, in order to protect the organic semiconductor materials and prevent the degradation of the OTFT characteristics, structures that include more stacks and corresponding additional processes are required. This, in turn, results in an increase in the number of masks required during manufacturing and a concomitant increase in manufacturing cost.

BRIEF SUMMARY

In accordance with the exemplary embodiments thereof described herein, the present invention provides organic thin film transistor (OTFT) array panels for displays and methods for making them that enable a substantial reduction to be achieved in the number of masks required for their fabrication and that substantially improve the stability of the organic semiconductors used therein, as well as the electrical characteristics of the resulting OTFTs.

In one exemplary embodiment, an OTFT array panel comprises: A gate line and a pixel electrode formed on a substrate, the gate line and pixel electrode each including a first conductive layer, comprising a transparent conductive oxide, and a second conductive layer comprising a metal; a data line crossing the gate line and including a source electrode; a drain electrode facing the source electrode and connected to the pixel electrode; and, an organic semiconductor in contact with the source electrode and the drain electrode.

The pixel electrode may include a first part, including the first and second conductive layers, and a second part that does not include the second conductive layer. The data line may include a third conductive layer comprising a transparent conductive oxide, and a fourth conductive layer comprising a metal. The third conductive layer may constitute the source electrode, and the source and the drain electrodes may be comprised of the same material. The transparent conductive oxide may comprise ITO or IZO. The metal may comprise molybdenum (Mo), chromium (Cr), aluminum (Al), copper (Cu), silver (Ag), or another metal.

The OTFT array panel may further include an interlayer insulating layer positioned between the gate line and the data line, and the interlayer insulating layer may have a first opening exposing a portion of the gate line and a second opening exposing the pixel electrode. The first opening includes a lower opening and an upper opening that is larger than the lower opening, and a gate insulator and the organic semiconductor may be formed in the lower and upper openings, respectively. The OTFT array panel may further include a storage electrode line that overlaps with the pixel electrode to form a storage capacitor. The OTFT array panel may further include a protection member for protectively covering the organic semiconductor.

An exemplary embodiment of a method for manufacturing an OTFT array panel includes: Forming a gate line and a pixel electrode on a substrate, each including a first conductive layer comprising a transparent conductive oxide and a second conductive layer comprising a metal; forming an interlayer insulating layer on the gate line and the pixel electrode; forming an opening in the interlayer insulating layer; forming a gate insulator in the opening; forming a data line, including a source electrode and a drain electrode, on the interlayer insulating layer and the gate insulator; and, forming an organic semiconductor on the source electrode and the drain electrode. The forming of the data line so as to include the source electrode and the drain electrode comprises sequentially stacking a third conductive layer, comprising a transparent conductive oxide, and a fourth conductive layer, comprising a metal on the interlayer insulating layer and the gate insulator; forming a first photosensitive member and a second photosensitive member thinner than the first photosensitive member on the fourth conductive layer; first etching the fourth conductive layer using the first and second photosensitive members as a mask; removing the second photosensitive member; etching the third conductive layer using the etched fourth conductive layer as a mask; and secondly etching the fourth conductive layer by using the first photosensitive member as a mask.

In the second etching of the fourth conductive layer, the second conductive layer of the pixel electrode may also be etched. The second photosensitive member may be formed at positions at which the source and drain electrodes are to be formed. The first and third conductive layers may be etched with the same etchant, and the second and fourth conductive layers may be etched with the same etchant. The forming of the first and second photosensitive members may comprise exposing with a mask having a light transmission region, a light blocking region, and a semi-light transmission (i.e., a translucent) region. The forming of the opening may also comprise exposing the interlayer insulating layer by using a mask having a light blocking region, a light transmission region, and a translucent region. One or both of the forming of the gate insulator and the forming of the organic semiconductor may be performed using an ink jet printing method.

The method may further include forming a protection member over the organic semiconductor for protectively covering it, and the protection member may also be formed using an ink jet printing method.

Yet another exemplary embodiment of a method for manufacturing an OTFT array panel includes: Forming a gate line on a substrate; forming an interlayer insulating layer having an opening on the gate line; forming a gate insulator in the opening; forming a data line, including a source electrode and a drain electrode, on the interlayer insulating layer and the gate insulator; forming a pixel electrode connected with the drain electrode; and, forming an organic semiconductor contacting the source and drain electrodes, wherein the gate line and the pixel electrode are formed using a first mask, the interlayer insulating layer is formed using a second mask, and the data line, including the source electrode and the drain electrode, are formed using a third mask.

The forming of the gate insulator and the organic semiconductor may be performed using an ink jet printing method.

The method may further include forming a protection member protectively covering the organic semiconductor, and the protection member may also be formed using an ink jet printing method.

A better understanding of the above and many other features and advantages of the novel OTFT array panels and the methods for making them of the present invention may be obtained from a consideration of the detailed description of some exemplary embodiments thereof below, particularly if such consideration is made in conjunction with the appended drawings, wherein like reference numerals are used to identify like elements illustrated in one or more of the figures thereof.

DETAILED DESCRIPTION

Figure 1:
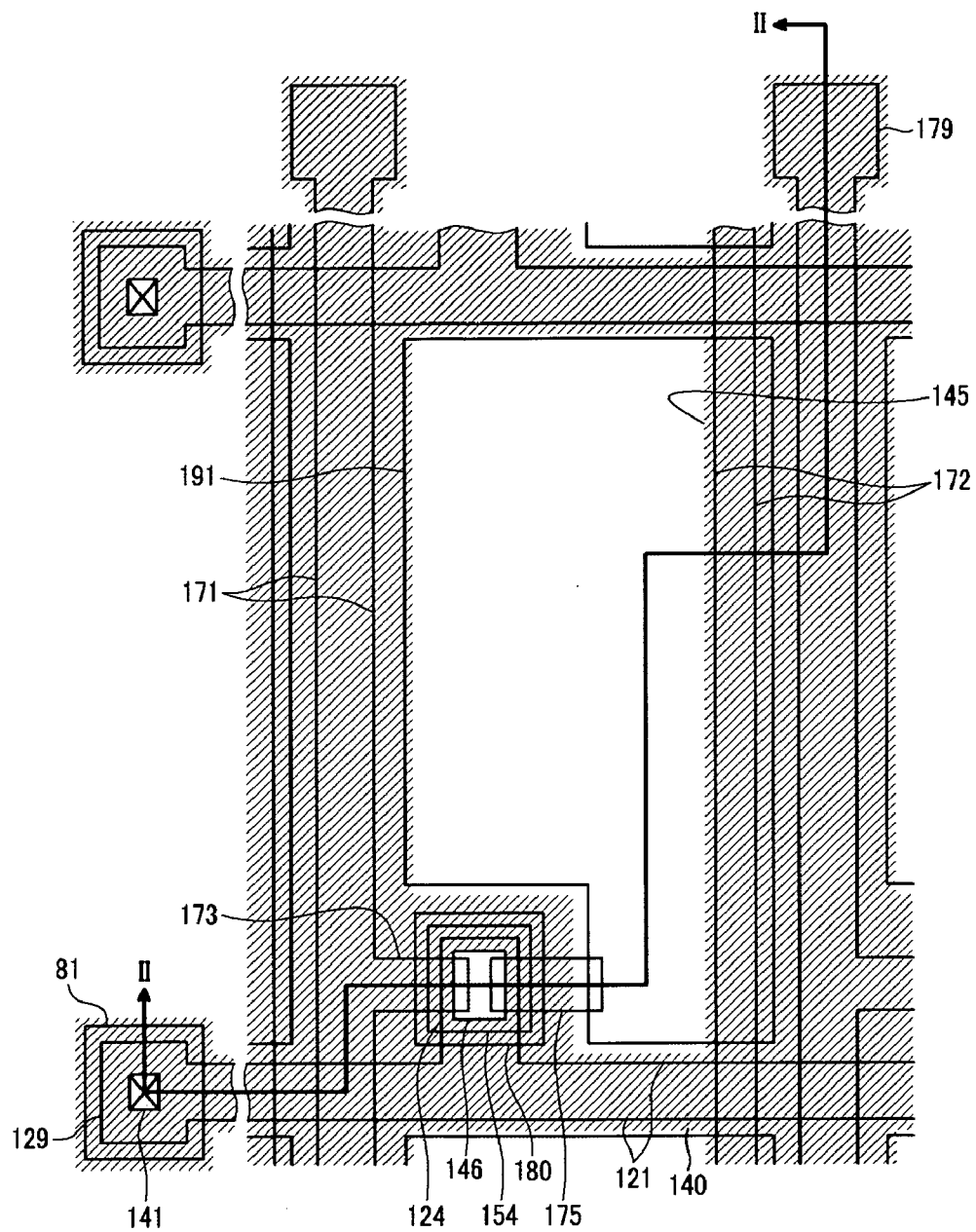
FIG. 1 is a partial top plan view of an exemplary embodiment of an organic thin film transistor (OTFT) array panel in accordance with the present invention, showing a single pixel area of the panel.
Figure 2:
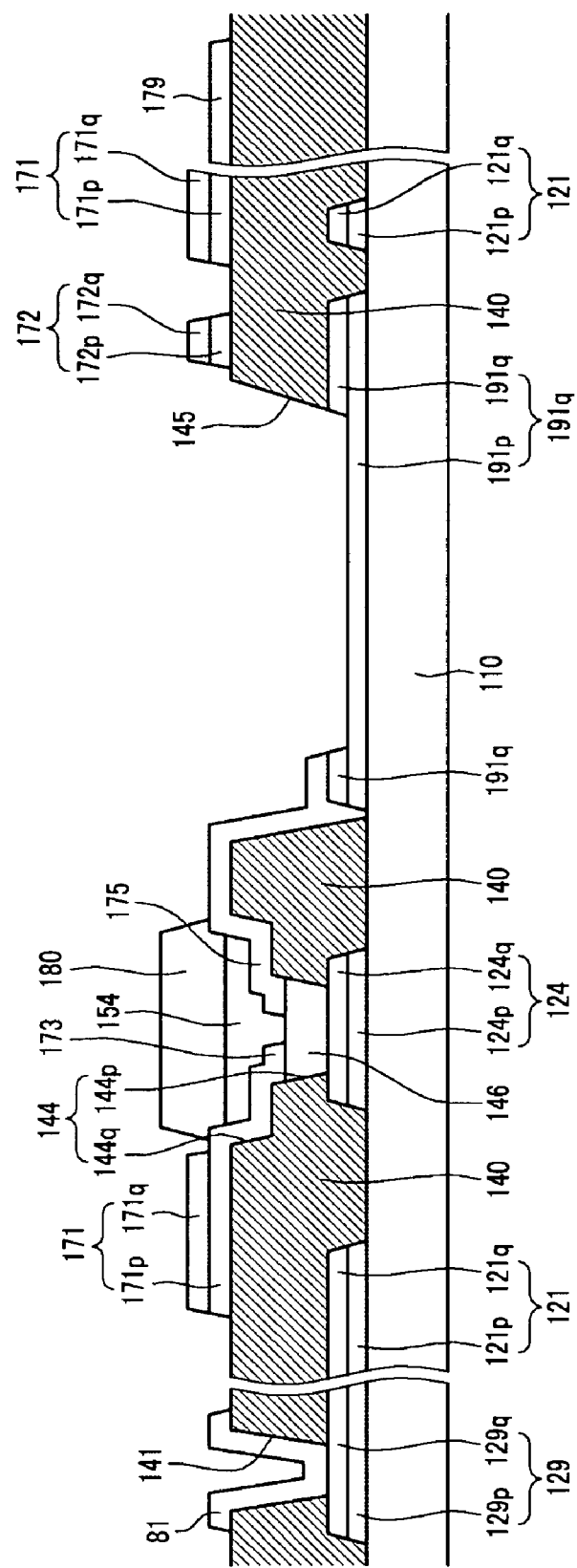
FIG. 2 is a partial cross-sectional view of the exemplary OTFT panel of FIG. 1, as seen along the lines of the section II-II taken therein.

An exemplary embodiment of an organic thin film transistor (OTFT) array panel in accordance with the present invention is described in detail below with reference to FIGS. 1 and 2, wherein FIG. 1 is a partial top plan view of the exemplary array panel, showing a single pixel area thereof, and FIG. 2 is a partial cross-sectional view of the exemplary panel of FIG. 1, as seen along the lines of the section II-II taken therein.

As illustrated in FIG. 1, the array panel comprises a plurality of gate lines 121 and pixel electrodes 191 formed on an insulating substrate 110 that is made of transparent glass, silicon, plastic, or the like. Each of the gate lines 121 transmits a gate signal and extends generally in a horizontal direction in the figure. Each gate line 121 includes a plurality of gate electrodes 124 that protrude upward and a large end portion 129 for a connection thereof to a different layer or an external driving circuit. A gate driving circuit (not illustrated) that generates the gate signals may be mounted on a flexible printed circuit film (not illustrated) that is mounted on the substrate 110, or alternatively, may be mounted directly on the substrate 110, or otherwise integrated thereon. When the gate driving circuit is integrated on the substrate 110, the gate lines 121 may be extended to connect directly with the gate driving circuit.

Each of the gate lines 121 includes a lower gate line 121$p$, including a lower gate electrode 124$p$ and a lower end portion 129$p$, and an upper gate line 121$q$, including an upper gate electrode 124$q$ and an upper end portion 129$q$. The lower gate line 121$p$ may be made of a transparent conductive oxide, such as indium tin oxide (ITO) or indium zinc oxide (IZO), and the upper gate line 121$q$ may be made of a low-resistance metal, such as molybdenum (Mo), chromium (Cr), aluminum (Al), copper (Cu), silver (Ag), or an alloy of any of the foregoing.

The pixel electrode 191 is separated from the gate line 121 and positioned between two adjacent gate lines 121. The pixel electrode 191 also includes a lower pixel electrode 191$p$ made of a transparent conductive oxide, such as ITO or IZO, and an upper pixel electrode 191$q$ made of a low-resistance metal. The pixel electrode 191 includes a first part at which the lower pixel electrode 191$p$ and the upper pixel electrode 191$q$ are formed together, and a second part at which only the lower pixel electrode 191$p$ is formed.

The sides of the gate line 121 and the pixel electrode 191 are preferably sloped toward the surface of the substrate 110 at an angle of from about 30° to about 80°.

As illustrated in FIG. 2, an interlayer insulating layer 140 is formed over the entire surface of the substrate, including over the gate lines 121. The interlayer insulating layer 140 may be made of a photosensitive organic material that may be formed by a solution process, e.g., an inkjet printing process, and its thickness may be controlled to be within a range of from about 5000 Å to about 4 micrometers (μm). The interlayer insulating layer 140 has a plurality of openings 144 and 145 and a plurality of contact holes 141 formed therein.

The opening 144 exposes the gate electrode 124, and includes a lower opening 144p and an upper opening 144q. The lower opening 144p and the upper opening 144q are formed stepwise, and the upper opening 144q is larger than the lower opening 144p. The opening 145 exposes the pixel electrode 191, and the contact hole 141 exposes the end portion 129 of the gate line 121.

A gate insulator 146 is formed in the lower opening 144p. In the particular embodiment illustrated, the interlayer insulating layer 140 surrounding the lower opening 144p serves as a bank or dam to confine the gate insulator 146. The gate insulator 146 may be made of an organic or an inorganic material. The organic material may comprise, for example, a soluble polymer, such as polyimide, polyvinyl alcohol, a fluorine-containing compound, Parylene, or the like. The inorganic material may comprise, for example, silicon oxide ($SiO_2$) that is surface-treated with octadecyltrichlorosilane (OTS).

A data line 171, a drain electrode 175, a storage electrode line 172, and a contact assistant 81 are each formed on the gate insulator 146 and the interlayer insulating layer 140. The data line 171 transmits a data signal and extends generally in the vertical direction in the figures so as to cross the gate line 121. Each data line 171 includes a source electrode 173 that protrudes toward the side and a large end portion 179 for a connection thereof to a different layer or an external driving circuit. A data driving circuit (not illustrated) that generates the data signals may be mounted on a flexible printed circuit film (not illustrated) that is mounted on the substrate 110, or alternatively, may be directly mounted on the substrate 110, or otherwise integrated thereon. When the data driving circuit is integrated on the substrate 110, the data line 171 may be extended so as to connect directly with the data driving circuit.

The data line 171 is formed with a double layer structure, including a lower data line 171p and an upper data line 171q. The lower data line 171p includes the source electrode 173 and the end portion 179, and may be made of a transparent conductive oxide, such as ITO or IZO. The upper data line 171q may be made of a low-resistance metal, such as Mo, Cr, Al, Cu, Ag, an alloy of any of the forgoing, or of another metal. In the particular embodiment illustrated, it is desirable that each of the lower data line 171p and the upper data line 171q have a different etching selectivity than the other, for the reasons discussed below.

The source electrode 173 is formed in a portion of the opening 144 of the interlayer insulating layer 140, and contacts the gate insulator 146 in the opening 144.

The drain electrode 175 is formed as an island type electrode, and faces the source electrode 173 on the gate insulator 146. A portion of the drain electrode 175 contacts the pixel electrode 191, and applies a data signal from the drain electrode 175 to the pixel electrode 191. The pixel electrode 191, to which the data voltage has been applied, together with a common electrode (not illustrated), which faces the pixel electrode 191, and to which a common voltage has been applied, generate an electric field to thereby determine the orientation of the molecules of a layer of liquid crystal (not illustrated) interposed between the two electrodes, or alternatively, to enable a current to flow to a light emission layer (not illustrated) so as to cause it to illuminate. Like the source electrode 173, the drain electrode 175 may be also made of a transparent conductive oxide, such as ITO or IZO.

The storage electrode line 172 extends substantially parallel to the data line 171 to cross the gate line 121. The storage electrode line 172 receives a selected voltage, and overlaps the pixel electrode 191 such that the two electrodes together form a storage capacitor.

The storage electrode line 172 is formed with a double layer structure, including a lower storage electrode line 172p and an upper storage electrode line 172q. The lower storage electrode line 172p may be made of a transparent conductive oxide, such as ITO or IZO, and the upper storage electrode line 172q may comprise a low-resistance metal, such as Mo, Cr, Al, Cu, Ag, or the like. In the particular embodiment illustrated, it is desirable that the lower storage electrode line 172p and the upper storage electrode line 172q each have a different etching selectivity than the other, for the reasons discussed below.

The contact assistant 81 is connected with the end portion 129 of the gate line 121 via the contact hole 141, and complements adhesion of the end portion 129 of the gate line 121 with an external device and also serves to protects the end portions. The contact assistant 81 may be made of a transparent conductive oxide, such as ITO or IZO.

Preferably, the respective sides of the data line 171, the drain electrode 175, the storage electrode line 172, and the contact assistant 81 are sloped toward the surface of the substrate 110 at an angle of from about 30° to 80°.

An organic semiconductor 154 is formed in the upper opening 144q. The organic semiconductor 154 may have a thickness of from about 300 Å to about 1 μm. The organic semiconductor 154 contacts the source electrode 173 and the drain electrode 175 in the upper opening 144q, and overlaps the gate electrode 124. The organic semiconductor 154 may contain a high molecular weight compound or a small molecular weight compound that is dissolved in an aqueous solution or an organic solvent. The organic semiconductor 154 may include a derivative including tetracene, pentacene or their substituents. The organic semiconductor 154 may also include oligothiophene, including 4 to 8 thiophenes connected at positions of 2 and 5 of a thiophene ring.

The organic semiconductor 154 may also include polythienylenevinylene, poly 3-hexylthiophene, polythiophene, phthalocyanine, metallized phthalocyanine, or their halogen derivatives. The organic semiconductor 154 may also include perylenetetracarboxylic dianhydride (PTCDA), naphthalenetetracarboxylic dianhydride (NTCDA), or their imide derivatives. The organic semiconductor 154 may also include a derivative, including a perylene, a coronene, and their substituents.

One gate electrode 124, one source electrode 173, and one drain electrode 175, together with the organic semiconductor 154, constitute a single OTFT, and the channel of the OTFT is formed in the organic semiconductor 154 between the source electrode 173 and the drain electrode 175. In the embodiment illustrated, facing portions of the source electrode 173 and the drain electrode 175 may be formed at an angle so as to extend the channel width to thereby improve the current characteristics of the device.

A protection member 180 is formed on the organic semiconductor 154. The protection member 180 may be made of an organic or an inorganic material. The organic material can comprise, for example, a fluorine-containing polymer or Parylene that may be formed at room temperature or at a relatively low temperature, and the inorganic material can comprise, for example, ITO or IZO. The protection member 180 serves to prevent the organic semiconductor 154 from being damaged during subsequent fabrication processes.

As discussed above, according to the exemplary embodiment of the present invention described herein, the gate line 121, the data line 171, and the storage electrode line 172 each includes a layer made of a low-resistance metal so as to reduce electrical resistance and thereby prevent signal delay and voltage drop.

The source electrode 173 and the drain electrode 175 that directly contact the organic semiconductor 154 are each made of a conductive oxide, such as ITO or IZO, which has a work function similar to that of the organic semiconductor 154, thereby enabling carriers to be effectively injected and moved to the organic semiconductor 154. The work function of ITO or IZO is about 4.5 to 5.0 eV, whereas, that of the organic semiconductor is about 5.0 to 5.5 eV.

Accordingly, unlike embodiments in which the source electrode 173 and the drain electrode 175 are made of a metal, a Schottky barrier is not formed between the metal and the organic semiconductor, so that the electrical characteristics of the resulting OTFT are relatively improved.

Figure 3:
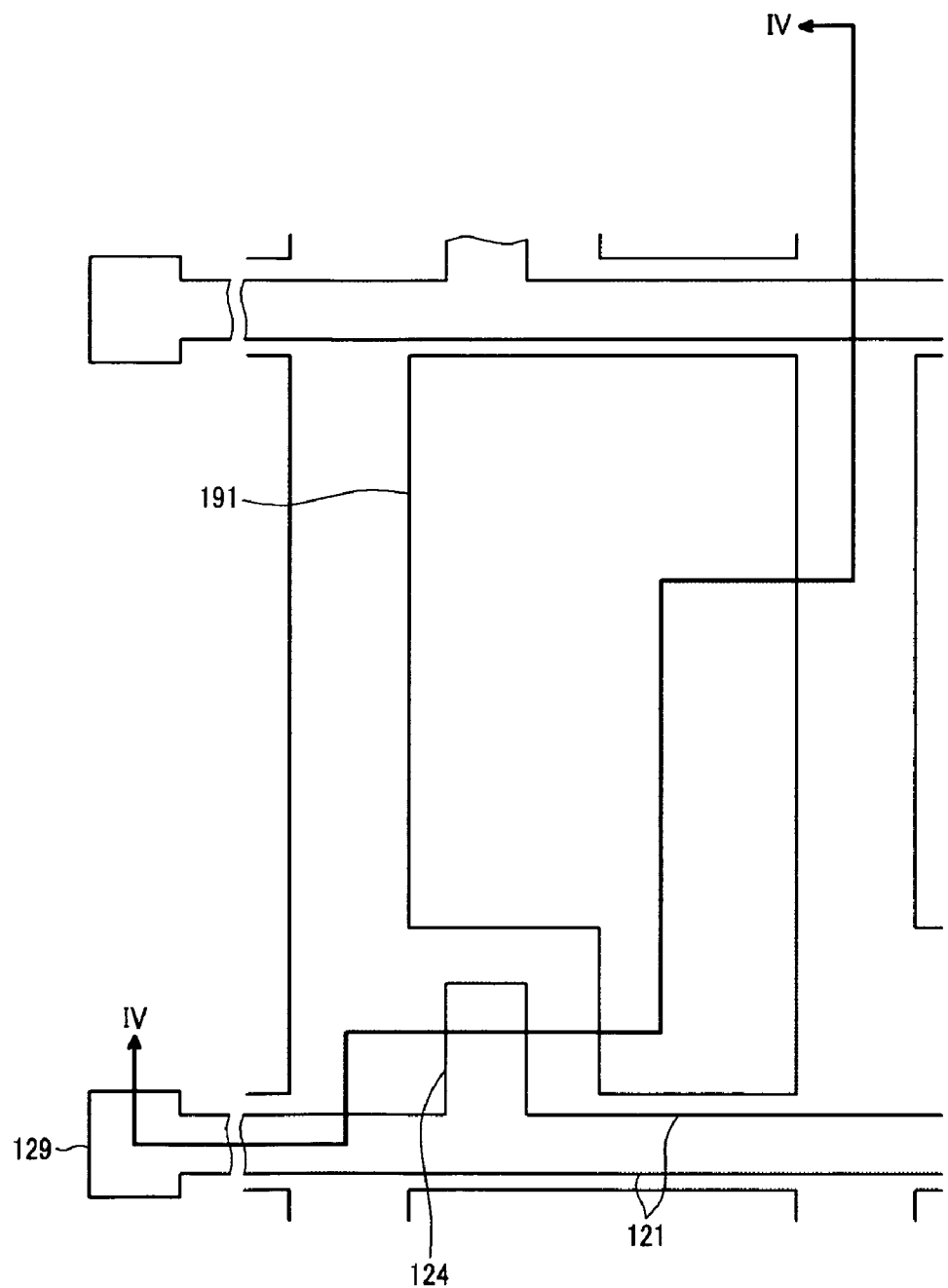
FIGS. 3, 6, 8, 16, and 18 are partial top plan views of the OTFT panel of FIG. 1, showing succeeding stages of an exemplary embodiment of a method for manufacturing the OTFT array panel.
Figure 8:
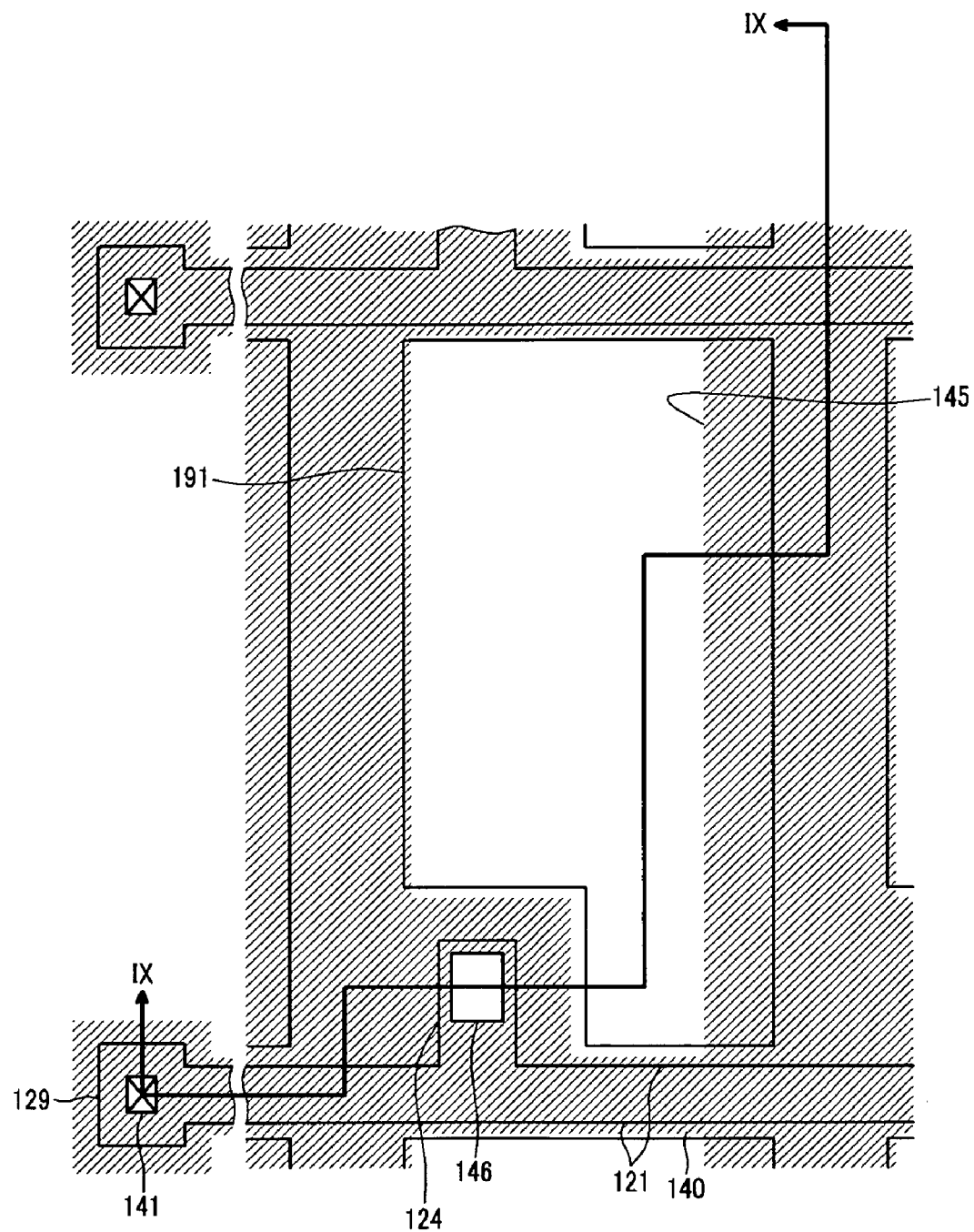
Figure 9:
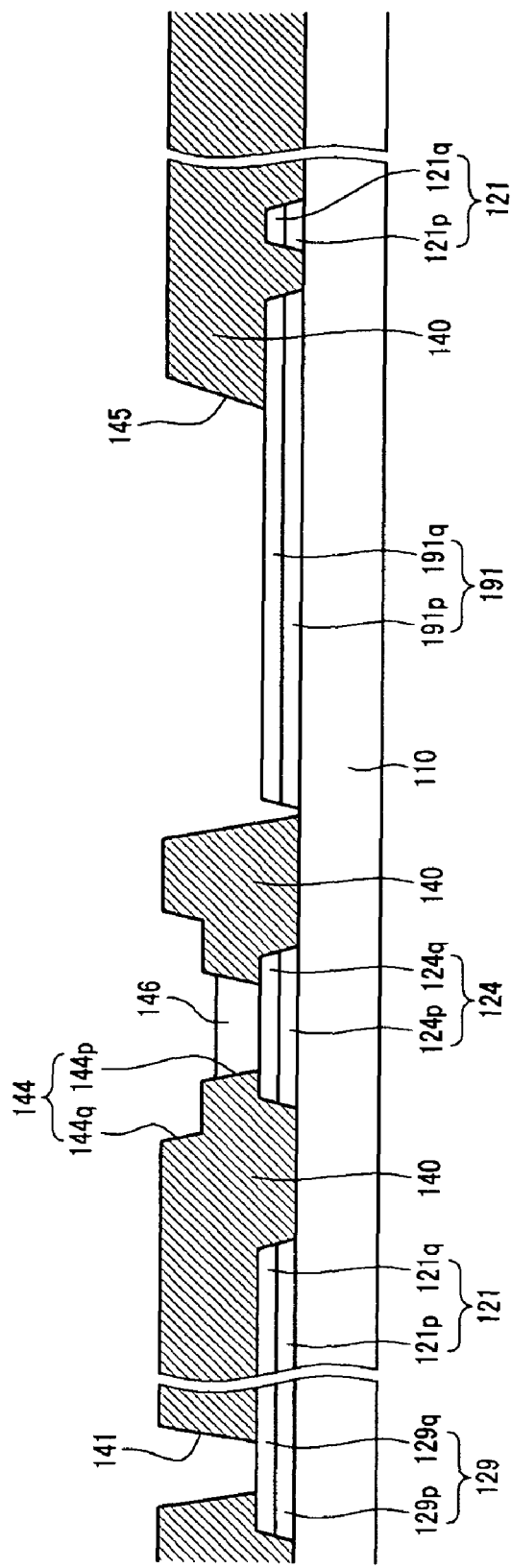
FIG. 9 is a partial cross-sectional view of the OTFT array panel of FIG. 8, as seen along the lines of the section IX-IX taken therein.

An exemplary embodiment of a method for manufacturing the OTFT array panel of FIGS. 1 and 2 is described in detail below with reference to FIGS. 3 to 19. FIGS. 3, 6, 8, 16, and 18 are partial top plan views of the OTFT panel of FIG. 1, showing succeeding stages of the exemplary embodiment, FIG. 4 is a partial cross-sectional view of the OTFT array panel of FIG. 3, as seen along the lines of the section IV-IV taken therein, FIG. 5 is a partial cross-sectional view of the OTFT array panel of FIGS. 3 and 4, showing an intermediate process of the exemplary manufacturing method, FIG. 7 is a partial cross-sectional view of the OTFT array panel of FIG. 6, as seen along the lines of the section VII-VII taken therein, FIG. 9 is a partial cross-sectional view of the OTFT array panel of FIG. 8, as seen along the lines of the section IX-IX taken therein, FIGS. 10 to 15 are partial cross-sectional views of the OTFT array panel in FIGS. 8 and 9, showing sequential processes of the exemplary manufacturing method, FIG. 17 is a partial cross-sectional view of the OTFT array panel of FIG. 16, as seen along the lines of the section XVII-XVII taken therein; and, FIG. 19 is a partial cross-sectional view of the OTFT array panel of FIG. 18, as seen along the lines of the section XIX-XIX taken therein.

Figure 4:
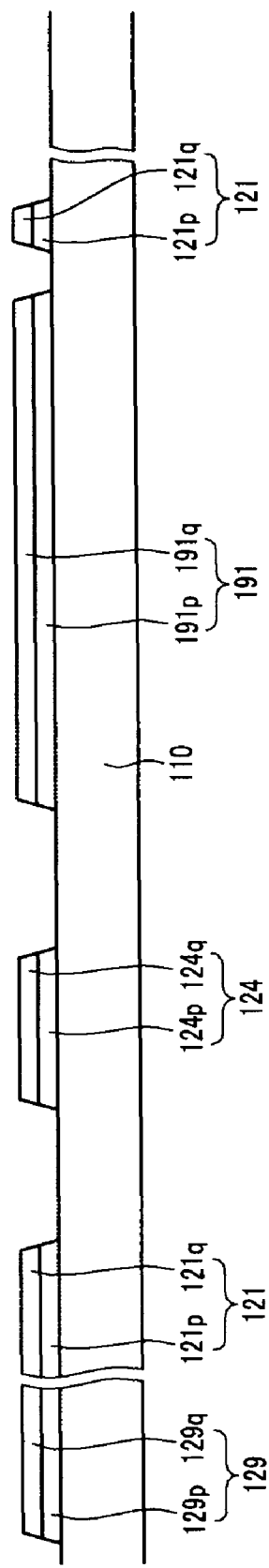
FIG. 4 is a partial cross-sectional view of the OTFT array panel of FIG. 3, as seen along the lines of the section IV-IV taken therein.

With reference to FIGS. 3 and 4, an ITO layer and an aluminum layer are sequentially formed on the substrate 110. Subsequently, the aluminum layer and the ITO layer are sequentially etched using respective appropriate etchants for aluminum and ITO to form a lower conductive layer and an upper conductive layer. The lower conductive layer comprises the lower gate lines 121p, including the lower gate electrode 124p and the end portion 129p, and a lower pixel electrode 191p. The upper conductive layer comprises the upper gate conductors 121q, 124q and 129q, and an upper pixel electrode 191q.

Figure 5:
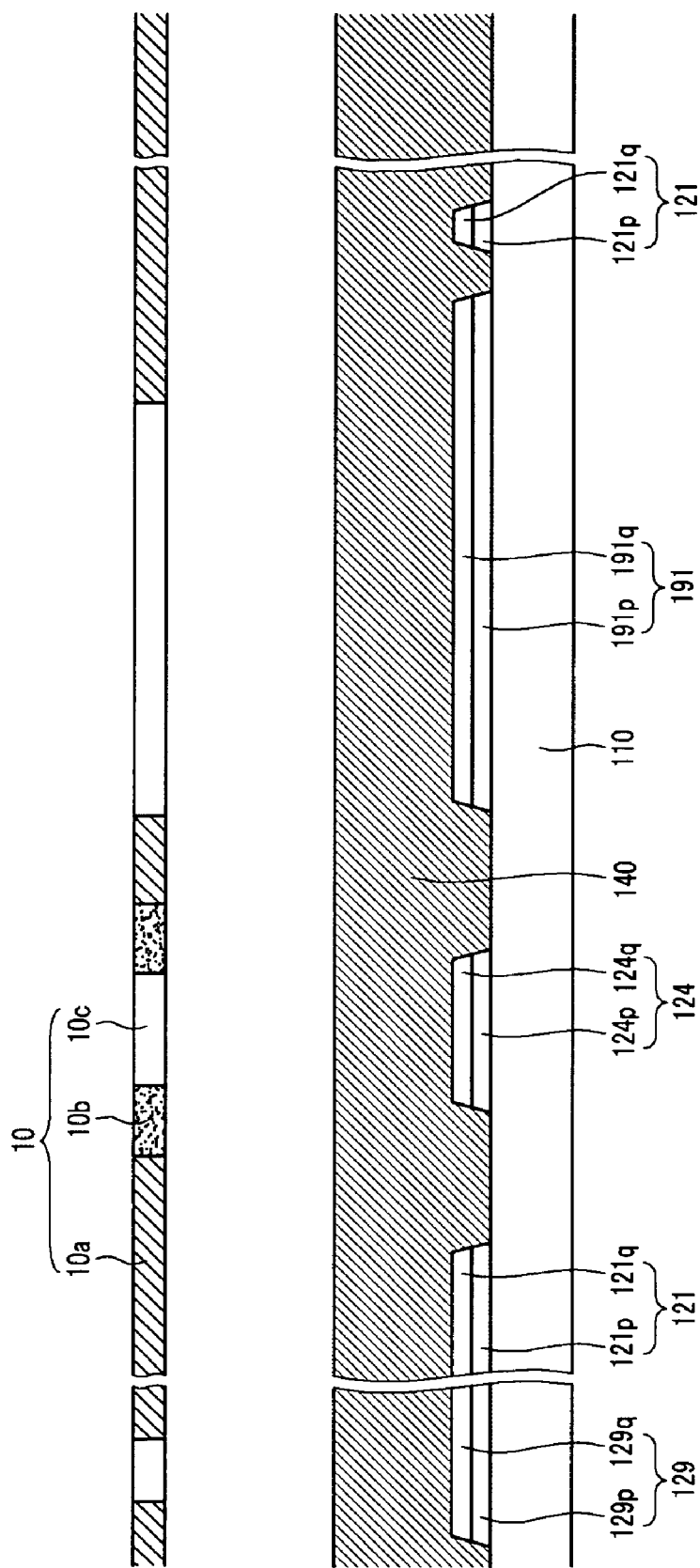
FIG. 5 is a partial cross-sectional view of the OTFT array panel of FIGS. 3 and 4, showing an intermediate process of the exemplary manufacturing method therefor.

With reference to FIG. 5, a photosensitive organic material is then coated on the substrate 110 to form the interlayer insulating layer 140, and a photo mask 10 is disposed above the interlayer insulating layer 140. The mask 10 includes a light transmission region 10c, a light blocking region 10a, and a semi-light transmission (i.e., a translucent) region 10b. The translucent region 10b of the mask may comprise a thin film with a slit or a lattice pattern, or a filter having a medium transmittance 10b. When a slit pattern is used, the width of the slits or the spacing between then is preferably smaller than the resolution of the exposure device used for the photolithography process.

Figure 6:
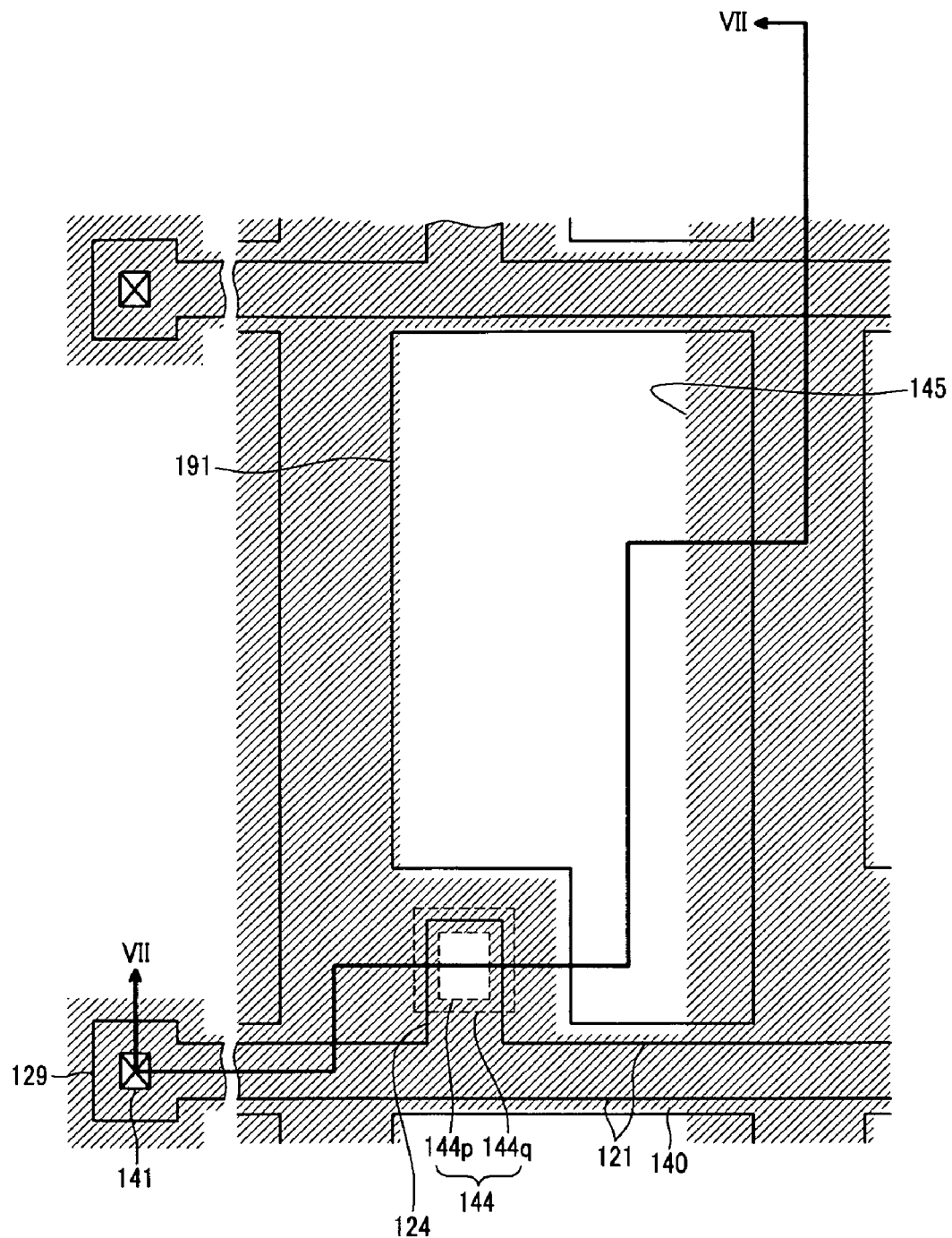
Figure 7:
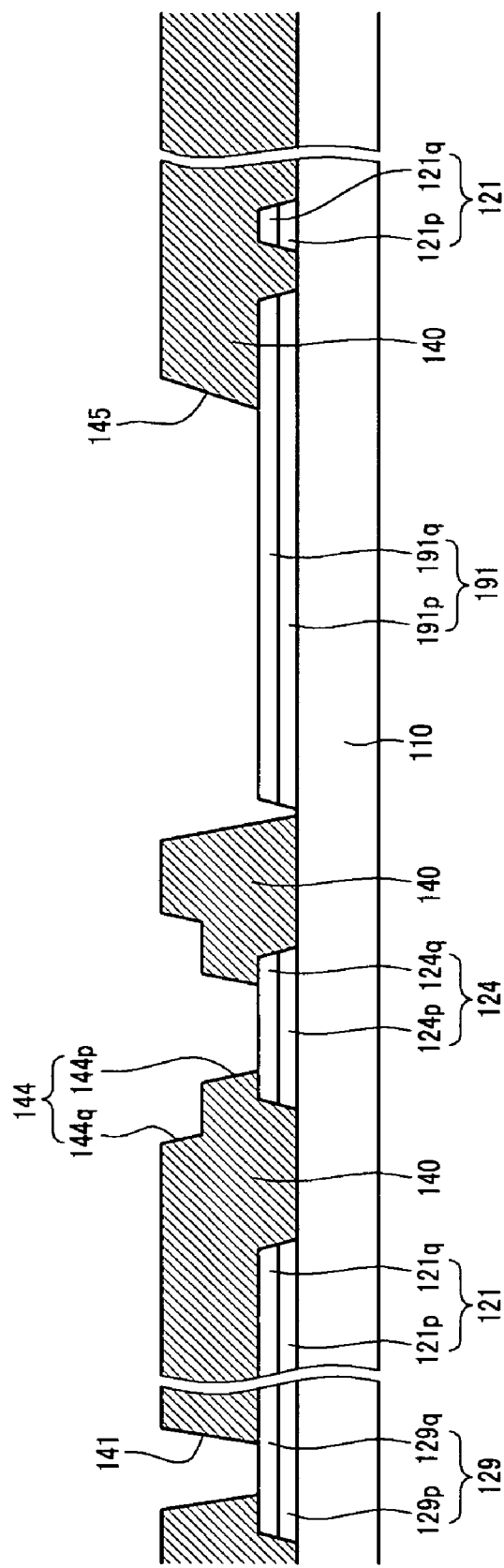
FIG. 7 is a partial cross-sectional view of the OTFT array panel of FIG. 6, as seen along the lines of the section VII-VII taken therein.

With reference to FIGS. 6 and 7, the interlayer insulating layer 140 is then exposed and developed using the mask 10 to form a plurality of openings 144 and 145 and the contact hole 141 therein. In the process illustrated, the interlayer insulating layer 140 positioned directly below the light transmission region 10c of the mask 10 is completely removed, whereas, only a portion of the interlayer insulating layer 140 positioned below the translucent region 10b is removed and a portion thereof remains. Accordingly, the lower opening 144p, the opening 145, and the contact hole 141 exposing the upper gate electrode 124q and the upper end portion 129q of the upper gate line 121q, are formed in the portions of the interlayer insulating layer 140 disposed below the light transmission region 10c, and the upper opening 144q, having a depth that is less than the thickness of the interlayer insulating layer 140, is formed in the portion of the interlayer insulating layer 140 disposed below the translucent region 10b, respectively.

With reference to FIGS. 8 and 9, the gate insulator 146 is then formed in the lower opening 144p. The gate insulator 146 may be formed by a solution process, such as an ink jet printing method or deposition, and is preferably formed using an ink jet printing method. When the gate insulator is formed by an ink jet printing method, a gate insulating solution is sprayed into the lower opening 144p by moving an ink jet head (not illustrated) over the substrate and then drying the solution deposited.

Figure 10:
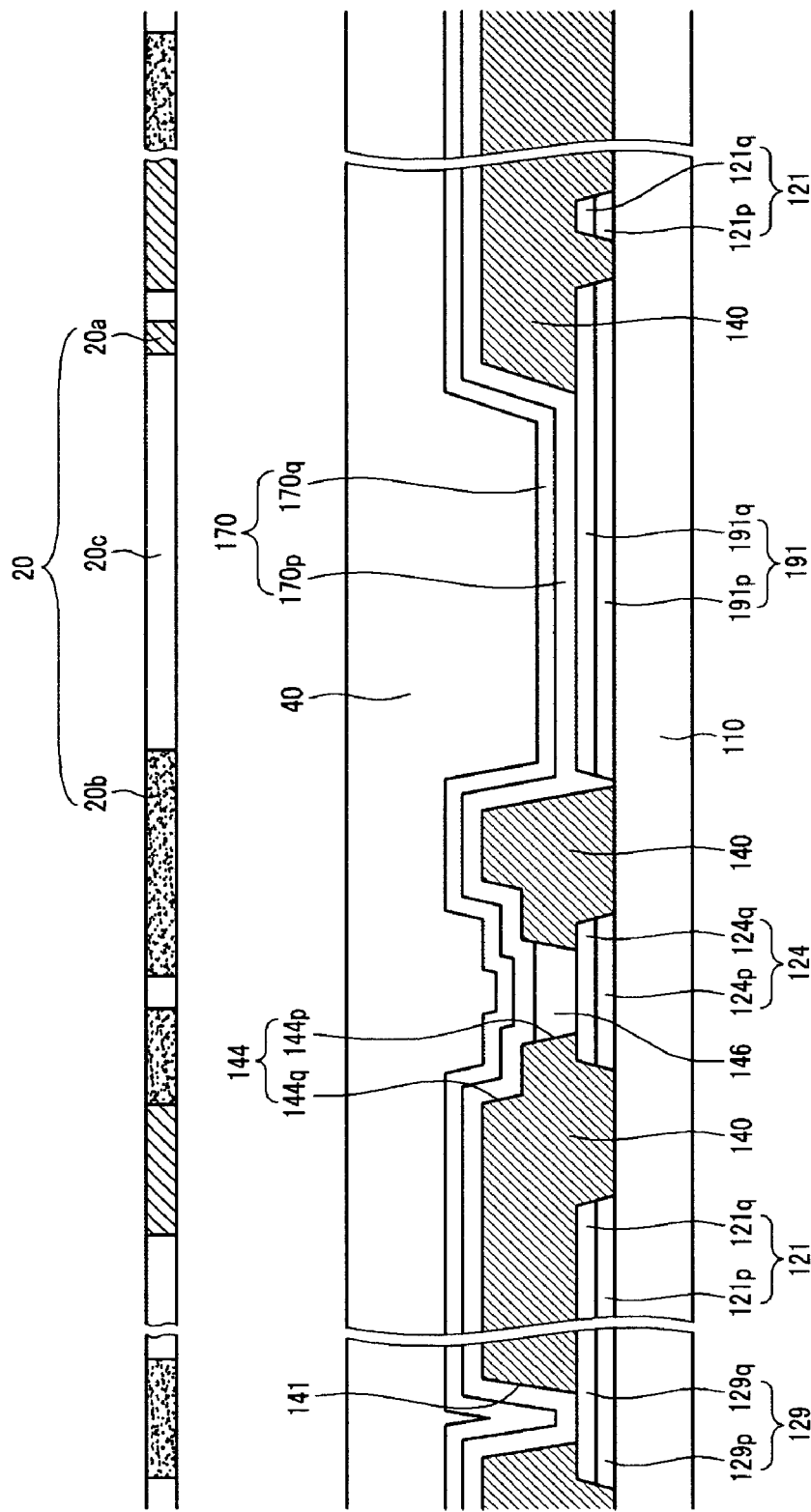
FIGS. 10 to 15 are partial cross-sectional views of the OTFT array panel in FIGS. 8 and 9, showing sequential processes of the exemplary manufacturing method therefor.

Next, with reference to FIG. 10, an ITO layer 170p and an aluminum layer 170q are sequentially stacked on the interlayer insulating layer 140 and the gate insulator 146. The ITO layer 170p may be made of amorphous ITO. The amorphous ITO may be formed by sputtering at a temperature below about 130° C., and preferably, is performed at room temperature. Forming the amorphous ITO layer at a relatively low temperature prevents the gate insulator 146, which is made of an organic material, from being damaged by heat, thereby enabling a good film quality to be maintained.

Figure 11:
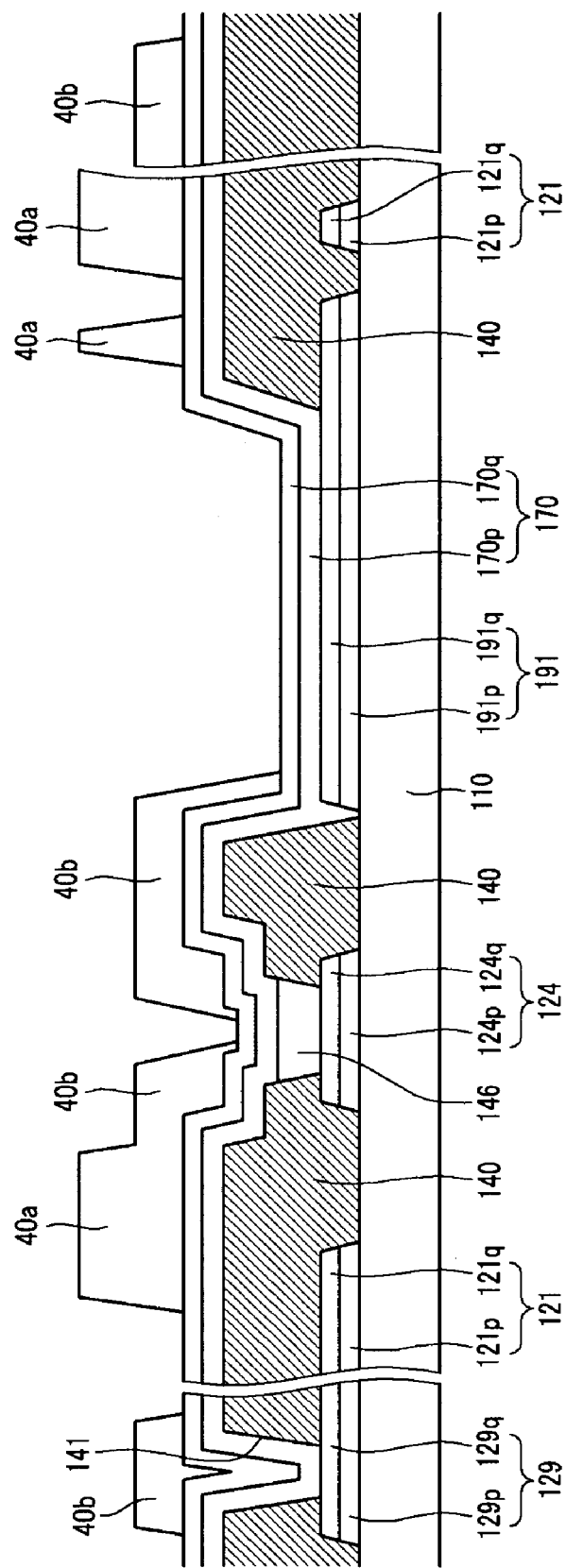

Subsequently, a photosensitive film 40 is coated on the aluminum layer 170q and exposed using a mask 20 having a light transmission region 20c, a light blocking region 20a, and a translucent region 20b, as described above. As illustrated in FIG. 11, as a result, photosensitive patterns 40a and 40b, each with a different thickness, are formed in the film. The first photosensitive pattern 40a is formed in regions exclusive of the regions in which the source electrode 173, the end portion 179 of the data line 171, and the storage electrode line 172 are to be formed, and the second photosensitive pattern 40b, which is thinner than the first photosensitive pattern 40a, is formed in regions inclusive of the regions in which the source electrode 173 and the end portion 179 of the data line 171, the drain electrode 175, and the contact assistant 81 are to be formed. In the embodiment illustrated, the ratio of the thicknesses of the first and second photosensitive patterns 40a and 40b will differ, depending on the parameters and conditions of the particular etching process used (as described below), and in a preferred embodiment, the thickness of the second photosensitive pattern 40b is about half of that of the first photosensitive pattern 40a.

Figure 12:
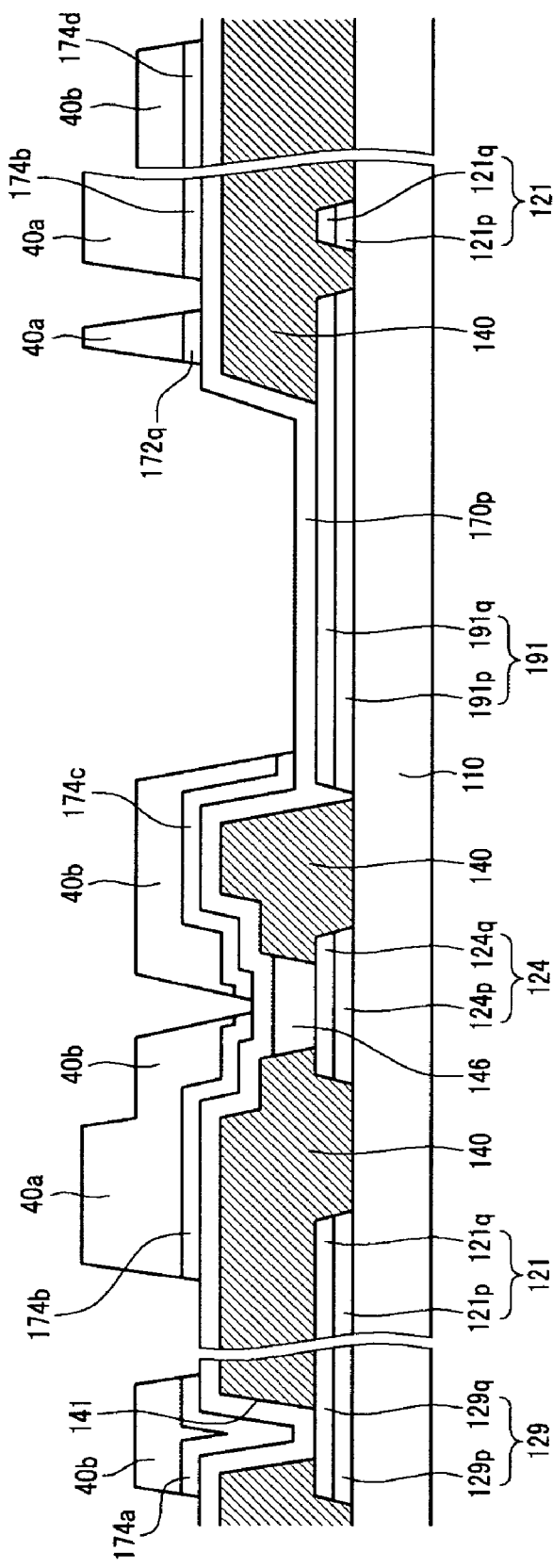

With reference to FIG. 12, the aluminum layer 170q is then etched using the first and second photosensitive patterns 40a and 40b as masks to form a plurality of data members 174a, 174b, 174c, and 174d, and an upper storage electrode line 172q, and to expose a part of the ITO layer 170p. In this process, the etching comprises a wet etching process using an appropriate etchant for aluminum, and because an aluminum etchant is used, the ITO layer 170p, which has different etching selectivity than that of aluminum, is not etched.

Figure 13:
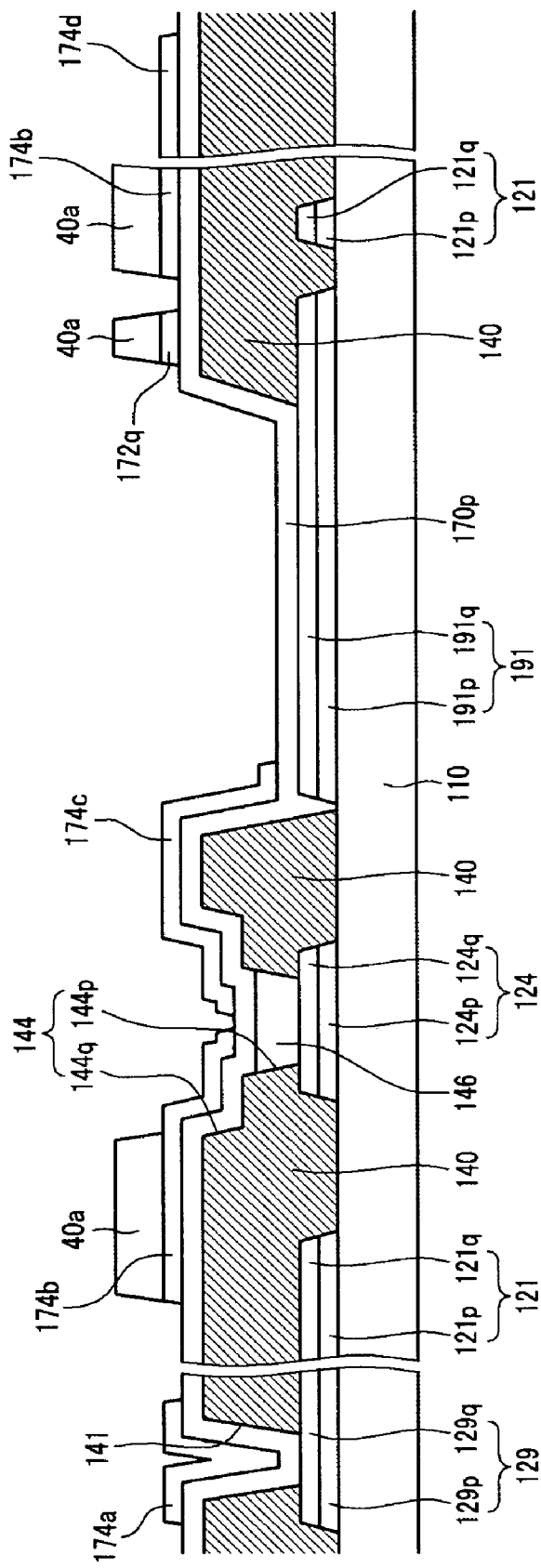

With reference to FIG. 13, the second photosensitive pattern 40b is removed using an etch-back process, such as ashing, and during this process, the thickness of the first photosensitive pattern 40a is also reduced a selected amount. As will be appreciated, degradation of the film quality of the gate insulator 146, which is made of an organic material, due to plasma and heat exposure during the ashing process, is prevented because the gate insulator 146 is protectively covered by the ITO layer 170p.

Figure 14:
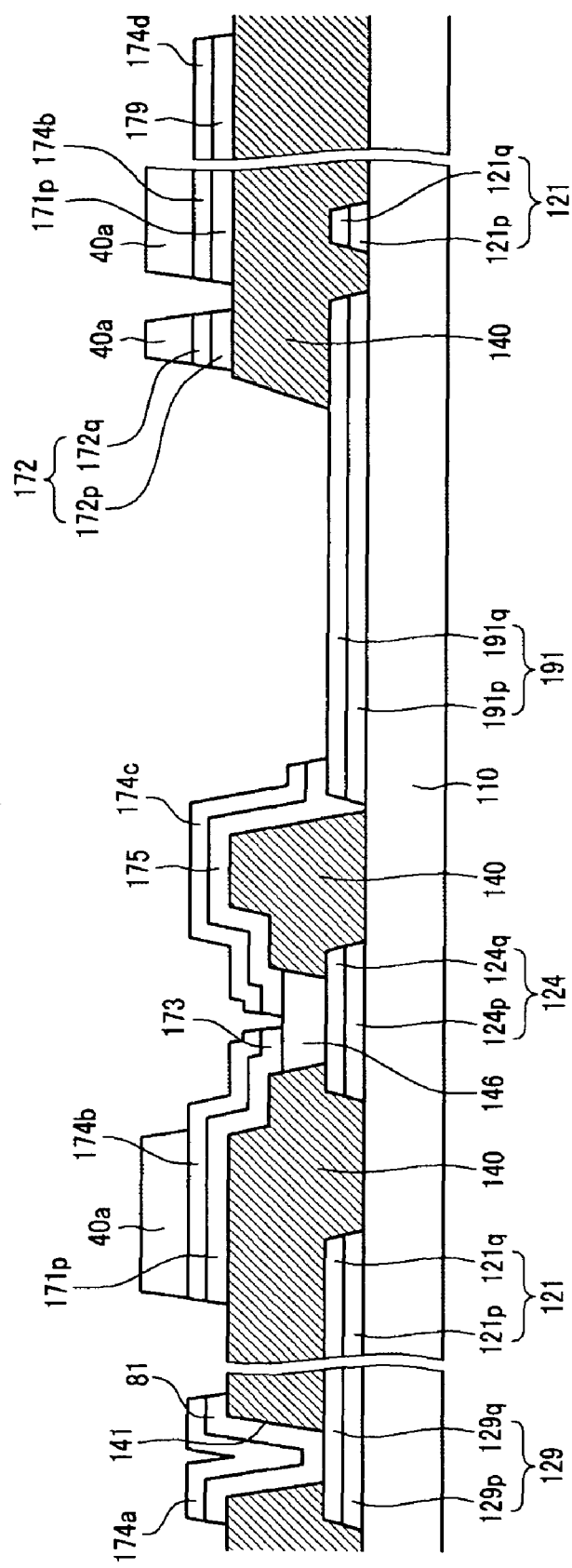

With reference to FIG. 14, the ITO layer 170p is etched using the plurality of data members 174a, 174b, 174c, and 174d and the upper storage electrode line 172q as masks to form the lower data line 171p, including the source electrode 173 and the end portion 179, the drain electrode 175, the lower storage electrode line 172p and the contact assistant 81. In this process, the etching comprises a wet etching process using an etchant suitable for ITO, and because an ITO etchant is used, the data members 174a, 174b, 174c, and 174d and the upper storage electrode line 172q, which are made of a material having a different etching selectivity than ITO, are not etched during the process.

Figure 15:
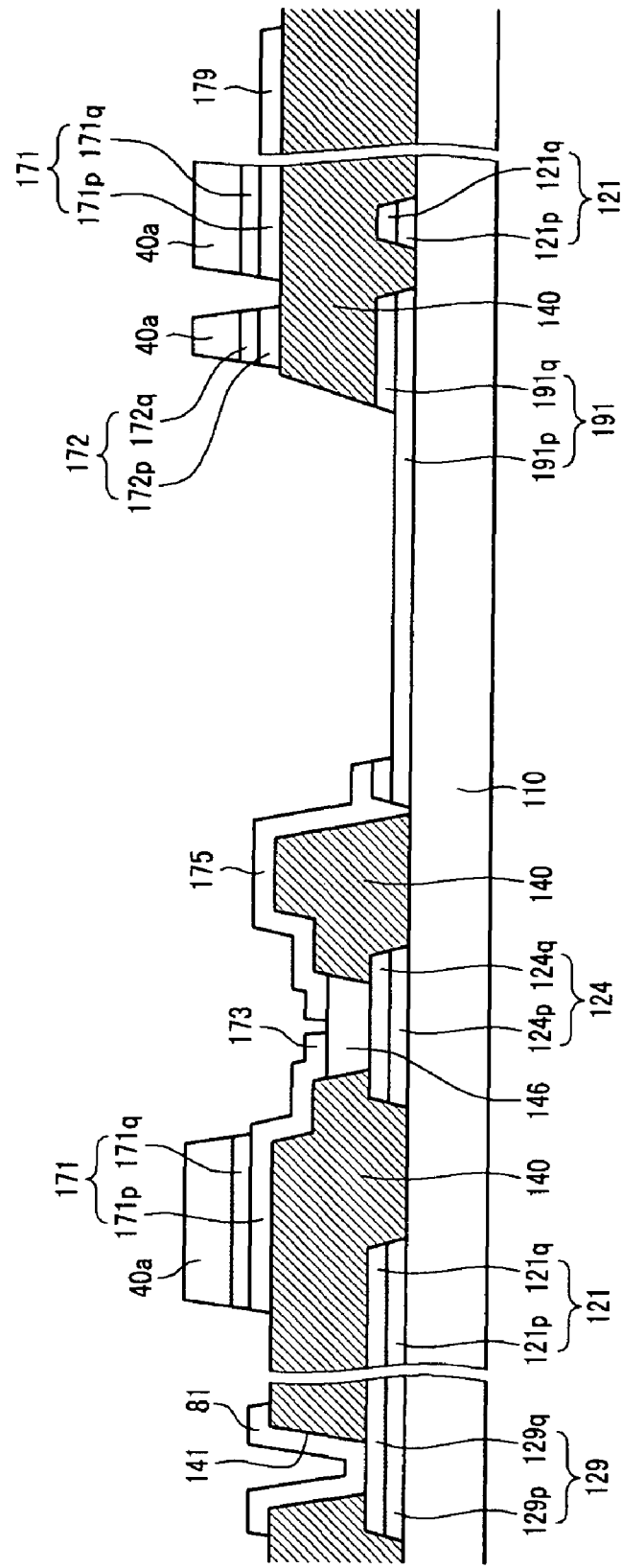

With reference to FIG. 15, the data members 174a, 174b, 174c and 174d, and the exposed portion of the upper pixel electrode 191q, are etched using the first photosensitive pattern 40a as a mask to form the upper data line 171q and to expose the lower pixel electrode 191p. In this process, the etching is a wet etching process using an etchant suitable for aluminum, and because an etchant suitable for aluminum is used, the lower data line 171p, the drain electrode 175, the lower pixel electrode 191p, and the contact assistant 81, which are made of a material having a different etching selectivity than that of aluminum, are not etched.

Figure 16:
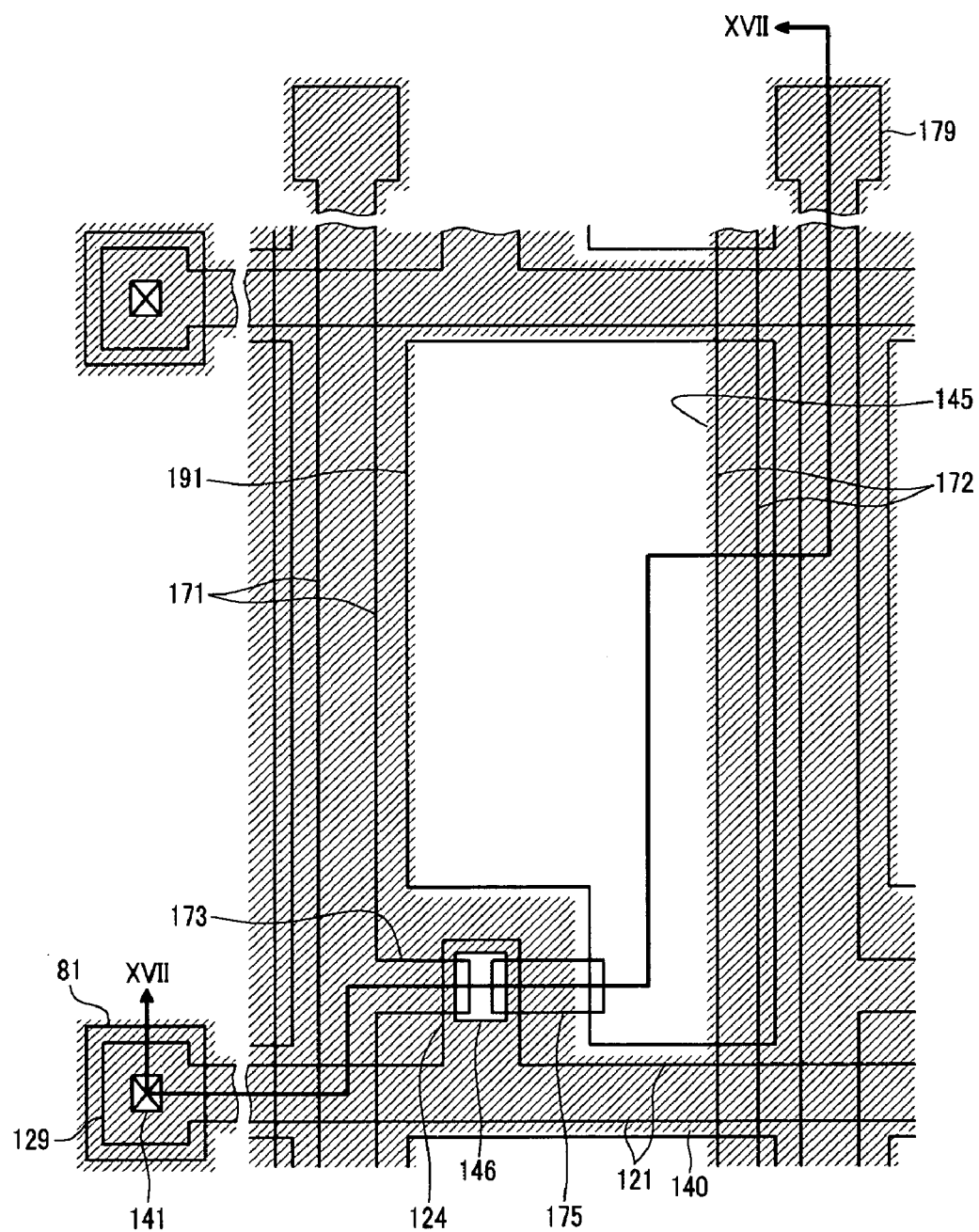
Figure 17:
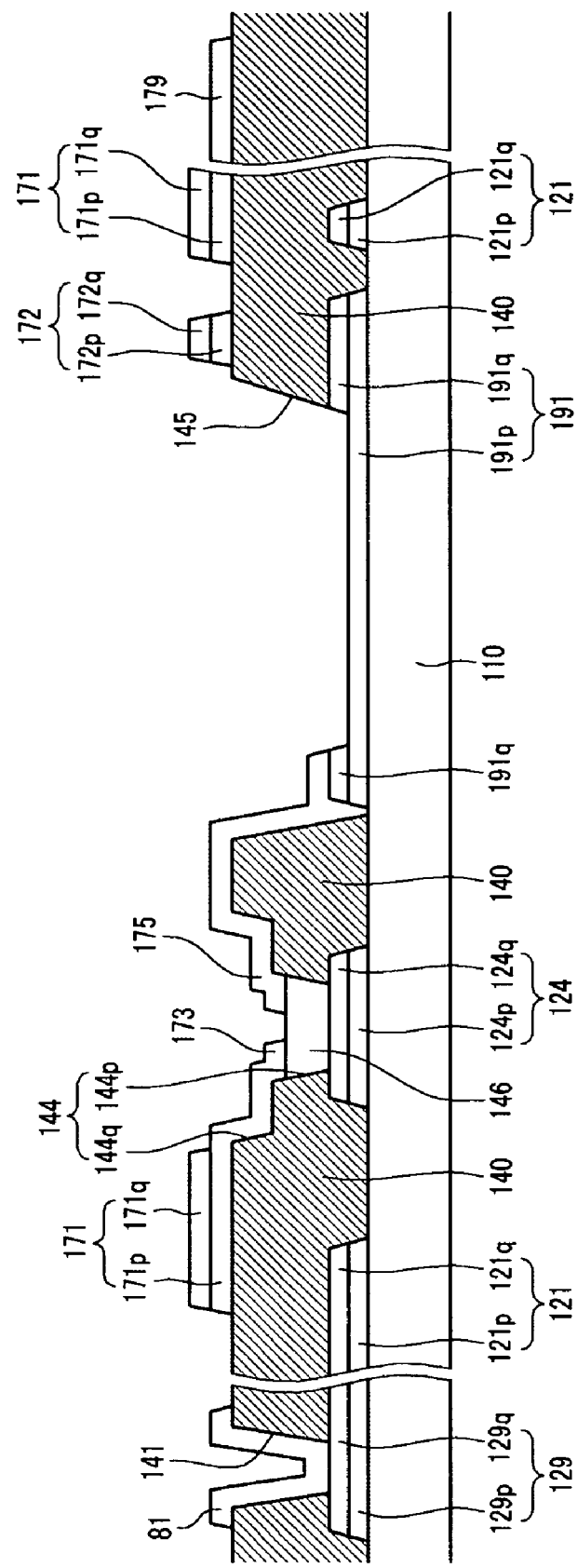
FIG. 17 is a partial cross-sectional view of the OTFT array panel of FIG. 16, as seen along the lines of the section XVII-XVII taken therein; and, FIG. 19 is a partial cross-sectional view of the OTFT array panel of FIG. 18, as seen along the lines of the section XIX-XIX taken therein.

With reference to FIGS. 16 and 17, the first photosensitive pattern 40a is removed to complete the formation of the data line 171, including the lower data line 171p and the upper data line 171q, the storage electrode line 172, including the lower storage electrode line 172p and the upper storage electrode line 172q, the pixel electrode 191, including the lower pixel electrode 191p and the upper pixel electrode 191q partially remaining on the lower pixel electrode 191p, and the contact assistant 81.

Figure 18:
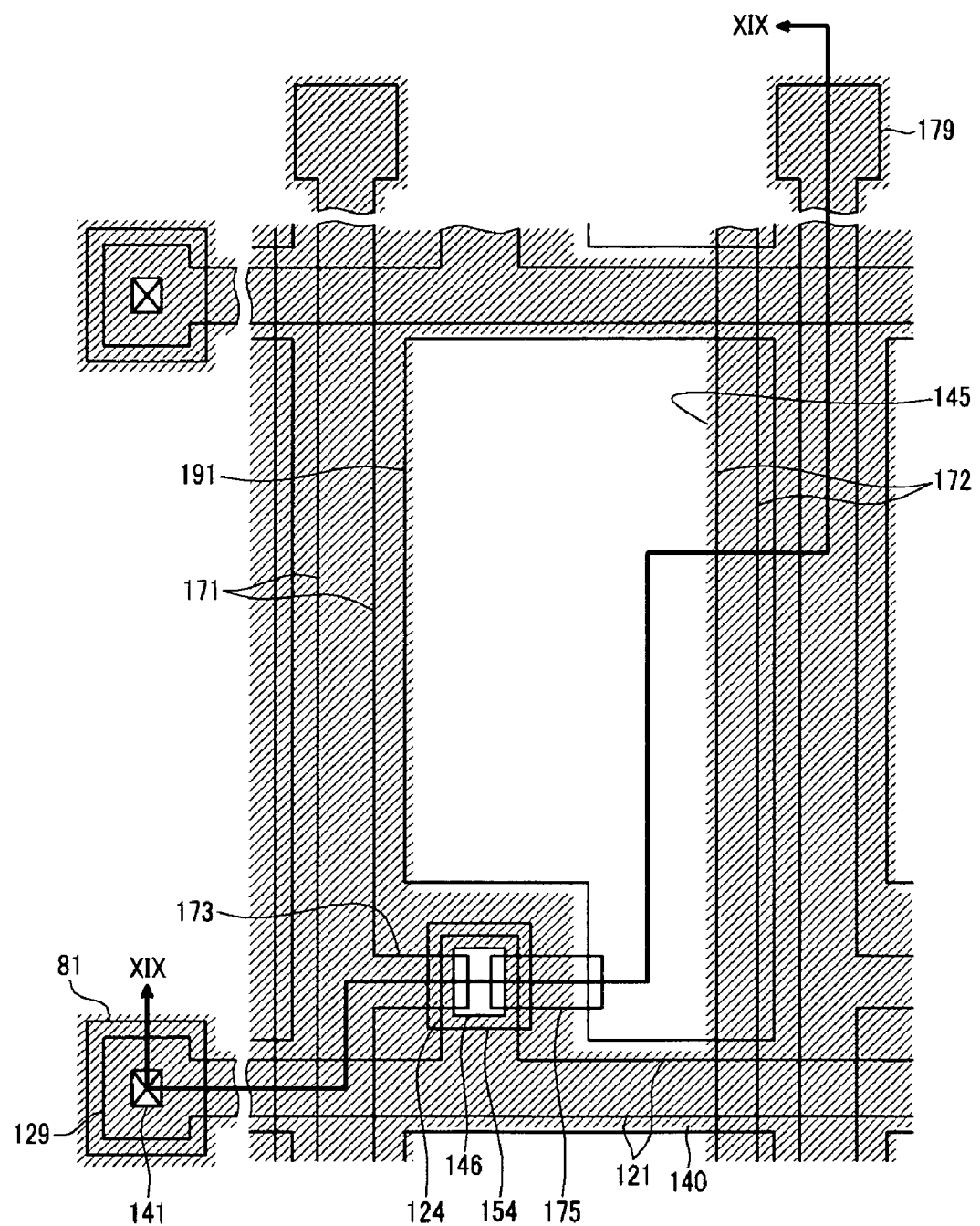

With reference to FIGS. 18 and 19, the organic semiconductor 154 is formed in the upper opening 144q. The organic semiconductor 154 may be formed using a solution process, such as an ink jet printing method, or by another deposition process, and is preferably formed by an ink jet printing method. Where an ink jet printing method is used, the organic semiconductor solution is sprayed into the upper opening 144q while moving an ink jet head (not illustrated) over the substrate and then drying the solution that was deposited.

Lastly, as illustrated in FIGS. 1 and 2, the protection member 180 is formed to cover the organic semiconductor 154. The protection member 180 may be also formed by an ink jet printing method.

In the exemplary method above, the gate line 121 and the pixel electrode 191 are formed using a single mask. Thus, a first mask, used to form the gate line 121 and the pixel electrode 191, a second mask, used to form the plurality of openings 144 and 145 and the plurality of contact holes 141, and a third mask, used to form the data line 171, including the source electrode, the drain electrode 175, and the storage electrode line 172, are required. That is, the OTFT array panel of the present invention can be manufactured using a total of three masks. Additionally, the manufacturing process is also considerably simplified because the gate line 121 and the pixel electrode 191 are formed using a single mask. By thus reducing the number of masks used for manufacturing the OTFT, the processes used for manufacturing the panels are simplified and manufacturing costs are thereby reduced.

Further, because the gate line 121 includes a low-resistance metal layer, the occurrence of signal delays and voltage drops is reduced. Also, because the source electrode and the drain electrode that contact the organic semiconductor are made of a material having a good contact characteristic with the organic semiconductor material, the electrical characteristics of the resulting OTFTs are substantially improved.

By now, those of skill in this art will appreciate that many modifications, substitutions and variations can be made in and to the OTFTs, display panels incorporating them, and the methods for making them of the present invention without departing from its spirit and scope. In light of this, the scope of the present invention should not be limited to that of the particular embodiments illustrated and described herein, as they are only exemplary in nature, but instead, should be fully commensurate with that of the claims appended hereafter and their functional equivalents.

What is claimed is:

1. An organic thin film transistor (OTFT) array panel, comprising:
a gate line and a pixel electrode formed on a substrate, the gate line and pixel electrode each including a first conductive layer comprising a transparent conductive oxide and a second conductive layer comprising a metal;
a data line crossing the gate line and comprising a source electrode;
a drain electrode facing the source electrode and connected with the pixel electrode;
an interlayer insulating layer positioned between the gate line and the data line, the interlayer insulating layer comprising a first opening; and,
an organic semiconductor disposed in contact with the source electrode and the drain electrode, the organic semiconductor disposed within the first opening,
wherein the first opening comprises a lower opening and an upper opening that is larger than the lower opening, and wherein a gate insulator and the organic semiconductor are respectively formed in the lower and upper openings.

2. The OTFT array panel of claim 1, wherein the pixel electrode comprises a first part having the first and second conductive layers, and a second part that does not have the second conductive layer.

3. The OTFT array panel of claim 1, wherein the data line comprises a third conductive layer comprising a transparent conductive oxide and a fourth conductive layer comprising a metal.

4. The OTFT array panel of claim 3, wherein the third conductive layer comprises the source electrode, and the source electrode and the drain electrode comprise the same material.

5. The OTFT array panel of claim 4, wherein the transparent conductive oxide comprises ITO or IZO.

6. The OTFT array panel of claim 5, wherein the metal comprises molybdenum (Mo), chromium (Cr), aluminum (Al), copper (Cu), or silver (Ag).

7. The OTFT array panel of claim 6, wherein the first opening exposes a portion of the gate line and the interlayer insulating layer comprises a second opening that exposes a portion of the pixel electrode.

8. The OTFT array panel of claim 1, further comprising a storage electrode line overlapping the pixel electrode.

9. The OTFT array panel of claim 1, further comprising a protection member covering the organic semiconductor.

10. The OTFT array panel of claim 1, wherein a side surface of the second conductive layer and a side surface of the drain electrode are disposed at the substantially same plane.

* * * * *